(12) United States Patent
Masuda

(10) Patent No.: US 8,404,574 B2
(45) Date of Patent: Mar. 26, 2013

(54) METHOD FOR MANUFACTURING SILICON CARBIDE SEMICONDUCTOR DEVICE

(75) Inventor: Takashi Masuda, Nagoya (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 13/142,147

(22) PCT Filed: Oct. 26, 2009

(86) PCT No.: PCT/JP2009/005645
§ 371 (c)(1),
(2), (4) Date: Jun. 24, 2011

(87) PCT Pub. No.: WO2010/073455
PCT Pub. Date: Jul. 1, 2010

(65) Prior Publication Data
US 2011/0256699 A1 Oct. 20, 2011

(30) Foreign Application Priority Data

Dec. 26, 2008 (JP) ................... 2008-333659

(51) Int. Cl.
H01L 21/283 (2006.01)
(52) U.S. Cl. ................. 438/571; 257/E21.159
(58) Field of Classification Search .................. 438/571; 257/E21.159
See application file for complete search history.

(56) References Cited

U.S. PATENT DOCUMENTS 6,110,813 A * 8/2000 Ota et al. .................. 438/597
6,274,889 B1 * 8/2001 Ota et al. .................. 257/77
8,168,485 B2 * 5/2012 Endo et al. ................ 438/167
2007/0134897 A1 * 6/2007 Nakamura et al. ......... 438/570
2009/0057686 A1 * 3/2009 Fukuda et al. ............. 257/77
2009/0090920 A1 * 4/2009 Endo et al. ................ 257/77
2009/0243026 A1 * 10/2009 Nakamura et al. ......... 257/471

FOREIGN PATENT DOCUMENTS

| JP | 62-209855 A | 9/1987 |
|---|---|---|
| JP | 2000-133819 A | 5/2000 |
| JP | 2000-164528 A | 6/2000 |
| JP | 2003-243323 A | 8/2003 |
| JP | 2004-266115 A | 9/2004 |
| JP | 2005-311347 A | 11/2005 |
| JP | 2007-149839 A | 6/2007 |
| JP | 2007-184571 A | 7/2007 |
| JP | 2008-210938 A | 9/2008 |

* cited by examiner

Primary Examiner — Alexander G. Ghyka
Assistant Examiner — Stanetta Isaac
(74) Attorney, Agent, or Firm — Sughrue Mion, PLLC

(57) ABSTRACT

Provided is a method for manufacturing a silicon carbide semiconductor device which is capable of obtaining the silicon carbide semiconductor device having a high forward current and a low reverse leakage current by a simple method. The method for manufacturing a silicon carbide semiconductor device includes the steps of: forming a film made of a first electrode material on one surface of a silicon carbide substrate, and forming an ohmic electrode by performing heat treatment at a temperature range of 930 to 950° C.; and forming a film made of a second electrode material on the other surface of the silicon carbide substrate, and forming a Schottky electrode by performing heat treatment.

4 Claims, 5 Drawing Sheets

METHOD FOR MANUFACTURING SILICON CARBIDE SEMICONDUCTOR DEVICE

CROSS REFERENCE TO RELATED APPLICATIONS

This application is a National Stage of International Application No. PCT/JP2009/005645 filed Oct. 26, 2009, claiming priority based on Japanese Patent Application No. 2008-333659, filed Dec. 26, 2008, the contents of all of which are incorporated herein by reference in their entirety.

TECHNICAL FIELD

The present invention relates to a method for manufacturing a silicon carbide semiconductor device.
Priority is claimed on Japanese Patent Application No. 2008-333659, filed Dec. 26, 2008, the content of which is incorporated herein by reference.

BACKGROUND ART

Silicon carbide semiconductors have excellent characteristics with a larger dielectric breakdown voltage, a wider energy bandgap and a higher thermal conductivity than silicon semiconductors. Therefore, silicon carbide semiconductors are expected to be applied to light-emitting devices, high-power devices, high-temperature-tolerant devices, radiation-proof devices, high-frequency devices and the like.

Incidentally, as devices (SiC semiconductor devices) in which the above-mentioned silicon carbide semiconductor is used, Schottky barrier diodes are known. The Schottky barrier diode is a diode in which rectification (Schottky effect) generated in the junction surface between a metal and a semiconductor is used, and has characteristics such that the forward drop voltage is lower than that of a PN diode, and the reverse recovery time is shorter than this. Therefore, the Schottky barrier diode is often used in a power supply circuit such as a switching regulator that performs high-frequency switching.

However, the Schottky barrier diode has a drawback in that the reverse leakage current is larger than that of the PN diode, and the reverse withstand voltage is lower than this. Therefore, in the Schottky barrier diode in which a SiC semiconductor device is used, there has been a problem in that an ohmic electrode which has a low contact resistance is formed in order to increase the forward current, and the reverse leakage current is reduced.

Generally, in order to obtain an ohmic electrode which has a low contact resistance, it is known that nickel (Ni) may be used as an electrode (see, for example, PTLs 1 or 2). In addition, it is known that after Ni is formed on the surface of a SiC substrate, heat treatment thereof at high temperature is effective in obtaining an ohmic electrode which has a low contact resistance.

On the other hand, various investigations have been made in order to reduce the reverse leakage current. For example, reduction in crystal defects of a micropipe or the like existing in a substrate or an epitaxial layer, a guard ring structure for preventing field effect concentration of the Schottky electrode end, and the like are proposed. Further, the impurity concentration of a SiC layer at the Schottky electrode side, or the height of the Schottky electrode, and the like have been investigated (see PTLs 3 to 5).

PATENT LITERATURE

[PTL 1] Japanese Unexamined Patent Application Publication No. 2003-243323
[PTL 2] Japanese Unexamined Patent Application Publication No. 2007-184571
[PTL 3] Japanese Unexamined Patent Application Publication No. 2000-133819
[PTL 4] Japanese Unexamined Patent Application Publication No. 2004-266115
[PTL 5] Japanese Unexamined Patent Application Publication No. 2007-149839

SUMMARY OF INVENTION

Technical Problem

However, the investigations for reducing the conventional leakage current disclosed in PTLs 3 to 5 seek a solution to the cause of the leakage current in a substrate, crystallization of an epitaxial layer, a structure and preparation conditions of the surface side at which the Schottky electrode exists, and the like. Since processes become complicated using any of the above methods, there has been a problem in that it is difficult to stably produce the Schottky barrier diode in which the leakage current is reduced.

The invention is contrived in view of such circumstances, and an object thereof is to provide a method for manufacturing a silicon carbide semiconductor device which is capable of obtaining a silicon carbide semiconductor device having a low forward voltage and a low reverse leakage current by a simple method.

Solution to Problem

The inventor has examined a method for suppressing the leakage current of the SiC semiconductor device (Schottky barrier diode), and has elucidated that the reverse leakage current increases when the heat treatment temperature of an ohmic electrode (Ni) is increased in order to obtain an ohmic electrode of a low contact resistance.

The inventor has found that a SiC semiconductor device is obtained which has characteristics such that the resistance value at the time of causing the forward current to flow is small and the leakage current at the time of applying a reverse voltage is low, by setting the heat treatment temperature at the time of forming the ohmic electrode to an optimum range, and has completed the invention.

That is, the invention relates to the following:
(1) A method for manufacturing a silicon carbide semiconductor device, including the steps of forming a film made of a first electrode material on one surface of ba silicon carbide substrate, and forming an ohmic electrode by performing heat treatment at a temperature range of 930 to 950° C.; and forming a film made of a second electrode material on the other surface of the silicon carbide substrate, and forming a Schottky electrode by performing heat treatment.
(2) The method for manufacturing a silicon carbide semiconductor device according to the above (1), wherein the first electrode material includes at least nickel.
(3) The method for manufacturing a silicon carbide semiconductor device according to the above (1) or (2), wherein the second electrode material is molybdenum.
(4) The method for manufacturing a silicon carbide semiconductor device according to any one of the above (1) to (3), wherein the heat treatment temperature in the step of forming the Schottky electrode is in the range of 600 to 700° C.
(5) The method for manufacturing a silicon carbide semiconductor device according to any one of the above (1) to (4), wherein the silicon carbide semiconductor device is a Schottky barrier diode.

Advantageous Effects of Invention

According to the method for manufacturing a silicon carbide semiconductor device of the invention, the configuration is made such that the temperature range of the heat treatment at the time of forming the ohmic electrode on one surface of the silicon carbide substrate is limited to 930 to 950° C. The silicon carbide semiconductor device having a high forward current and a low reverse leakage current is obtained by forming the Schottky electrode on the other surface of the above-mentioned silicon carbide substrate. That is, when the ohmic electrode is formed on the surface of the silicon carbide substrate on the opposite side to which the Schottky electrode is formed, it is possible to manufacture the silicon carbide semiconductor device having a high forward current and a low reverse leakage current by a simple method in which the heat treatment temperature is set to the optimum temperature range.

DESCRIPTION OF EMBODIMENTS

Figure 1:
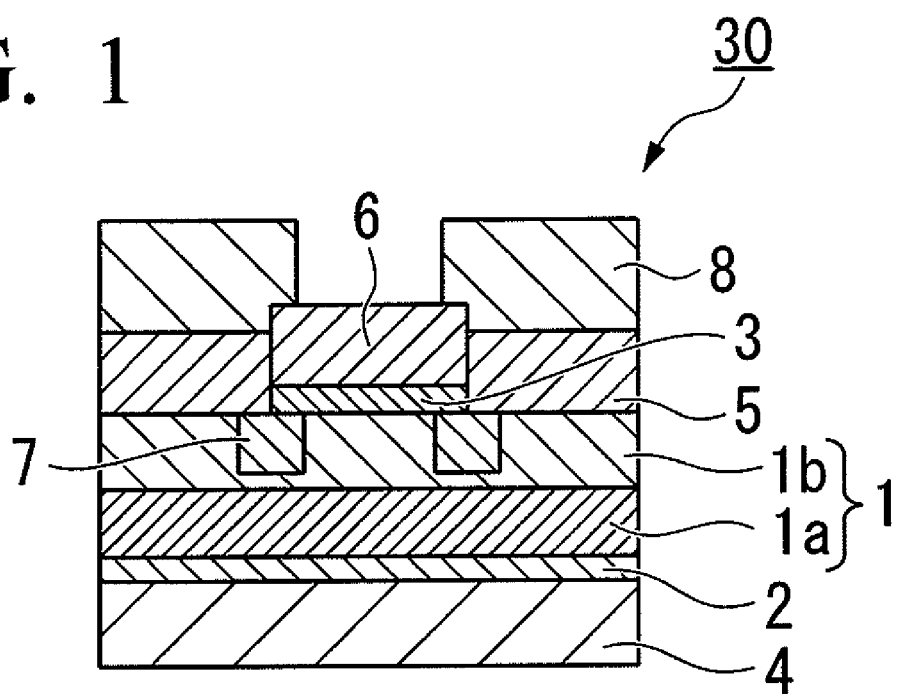
FIG. 1 is a schematic cross-sectional view illustrating a Schottky barrier diode as one embodiment and to which the invention is applied.

Hereinafter, reference will be made to the drawings to give a detailed description of a method for manufacturing a silicon carbide semiconductor device as one embodiment and to which the invention is applied. Here, as one of the silicon carbide semiconductor devices, description will be made using a Schottky barrier diode. In the drawings used in the following description, the featured portions of the invention may be enlarged, for convenience, in order to make the features thereof easier to understand, and the dimension ratios and the like for each of the components are not limited to the same dimensions as in reality.

FIG. 1 is a schematic cross-sectional view illustrating a Schottky barrier diode as one embodiment and to which the invention is applied. As shown in FIG. 1, a Schottky barrier diode 30 is schematically composed of a silicon carbide (SiC) substrate 1, an ohmic electrode (electrode having an ohmic property) 2 provided on one surface of the SiC substrate 1, and a Schottky electrode (electrode having a Schottky property) 3 provided on the other surface of the SiC substrate 1. In particular, the SiC substrate 1 is composed of an n$^+$-type SiC semiconductor substrate 1a, and an n$^-$-type SiC semiconductor layer 1b epitaxially grown on the n$^+$-type SiC semiconductor substrate 1a.

The n$^+$-type SiC semiconductor substrate 1a is an n-type 4H—SiC substrate, and is for example a substrate having a thickness of 200 to 400 μm in which nitrogen of $1.0 \times 10^{18}$ to $1.0 \times 10^{19}$ cm$^{-3}$ is doped. In addition, the n$^-$-type SiC semiconductor layer 1b is, for example, an epitaxial growth layer having a thickness of 4 to 10 μm, and is a layer in which nitrogen of 0.5 to $2.0 \times 10^{16}$ cm$^{-3}$ is doped.

The ohmic electrode 2 is provided on the bottom of the SiC substrate 1, that is, the surface of the n$^+$-type SiC semiconductor substrate 1a on the side opposite to the n$^-$-type SiC semiconductor layer 1b. An electrode pad 4 serving as a cathode electrode is provided on the bottom of the ohmic electrode 2 (that is, the surface on the side opposite to the n$^+$-type SiC semiconductor substrate 1a).

Although a material of the ohmic electrode 2 (first electrode material) is not particularly limited insofar as an ohmic junction to the n$^+$-type SiC semiconductor substrate 1a is formed, the material preferably contains, for example, nickel (Ni) or nickel/titanium (Ni/Ti) and the like. In addition, the thickness of the ohmic electrode 2 is preferably in the range of 20 to 1,000 nm, more preferably in the range of 50 to 200 nm, and particularly preferably in the range of 90 to 110 nm. When the thickness thereof is less than 20 nm, it is not preferable because the electrode becomes non-ohmic. In addition, when the thickness thereof exceeds 1,000 nm, it is not preferable because characteristic deterioration occurs due to an increase in carbon precipitation.

Although a material of the electrode pad 4 is not particularly limited, it is possible to use, for example, titanium/nickel/silver (Ti/Ni/Ag) and the like. In addition, the thickness of the electrode pad 4 is preferably in the range of 200 to 700 nm.

The upper surface of the SiC substrate 1, that is, the surface of the n$^-$-type SiC semiconductor layer 1b on the side opposite to the n$^+$-type SiC semiconductor substrate 1a is coated by a silicon oxide film 5 having a thickness of a few μm or so. An opening is provided in a portion of the silicon oxide film 5, and the Schottky electrode 3 is provided on the surface of the n$^-$-type SiC semiconductor layer 1b exposed from this opening. An electrode pad 6 serving as an anode electrode is provided on the upper surface of the Schottky electrode 3.

Although a material of the Schottky electrode 3 (second electrode material) is not particularly limited insofar as it is a metal having a large barrier to the n$^-$-type SiC semiconductor layer 1b, it is possible to use, for example, molybdenum (Mo), titanium (Ti), nickel (Ni) and the like. In the embodiment, it is particularly preferable to use molybdenum (Mo) because of stability even at high temperature. In addition, the thickness of the Schottky electrode 3 is preferably in the range of 10 to 1,000 nm, more preferably in the range of 50 to 500 nm, and particularly preferably in the range of 90 to 110 nm. When the thickness thereof is less than 10 nm, it is not preferable because of the unstable characteristics thereof. In addition, when the thickness thereof exceed 1,000 nm, it is not preferable because of peel-off due to stress.

Although a material of the electrode pad 6 is not particularly limited, it is possible to use, for example, nickel/titanium/aluminum (Ni/Ti/Al) and the like. In addition, the thickness of the electrode pad 6 is preferably in the range of 2,000 to 7,000 nm.

In addition, a p-type region 7 of a low-impurity concentration as a JTE (Junction Termination Extension) structure is provided in the surface of the n$^-$-type semiconductor layer 1b on the side opposite to the n$^+$-type SiC semiconductor substrate 1a. The p-type region 7 is provided in the periphery of the Schottky electrode 3 so as to partially overlap the Schottky electrode 3.

In the p-type region 7, for example, aluminum (Al) is implanted. The Al concentration is preferably, for example, $1.0 \times 10^{17}$ to $1.0 \times 10^{19}$ cm$^{-3}$. In addition, the thickness of the p-type region 7 is preferably 0.1 to 1.0 μm.

The upper surface of the silicon oxide film 5 is coated by a protective layer 8 made of polyimide and the like. An opening is provided in a portion of the protective layer 8, and the upper surface of electrode pad 6 is exposed from this opening.

The central region surrounded by the p-type region 7 is an active region as a Schottky diode.

Next, a description will be made of a method for manufacturing the Schottky bather diode 30 according to the embodiment.

The Schottky barrier diode 30 according to the embodiment can be manufactured by, for example, the following method. (a) to (d) of FIG. 2, (a) to (d) of FIG. 3 and (a) to (d) of FIG. 4 are process cross-sectional views illustrating methods of manufacturing the Schottky barrier diode 30 according to the embodiment.

Figure 2:
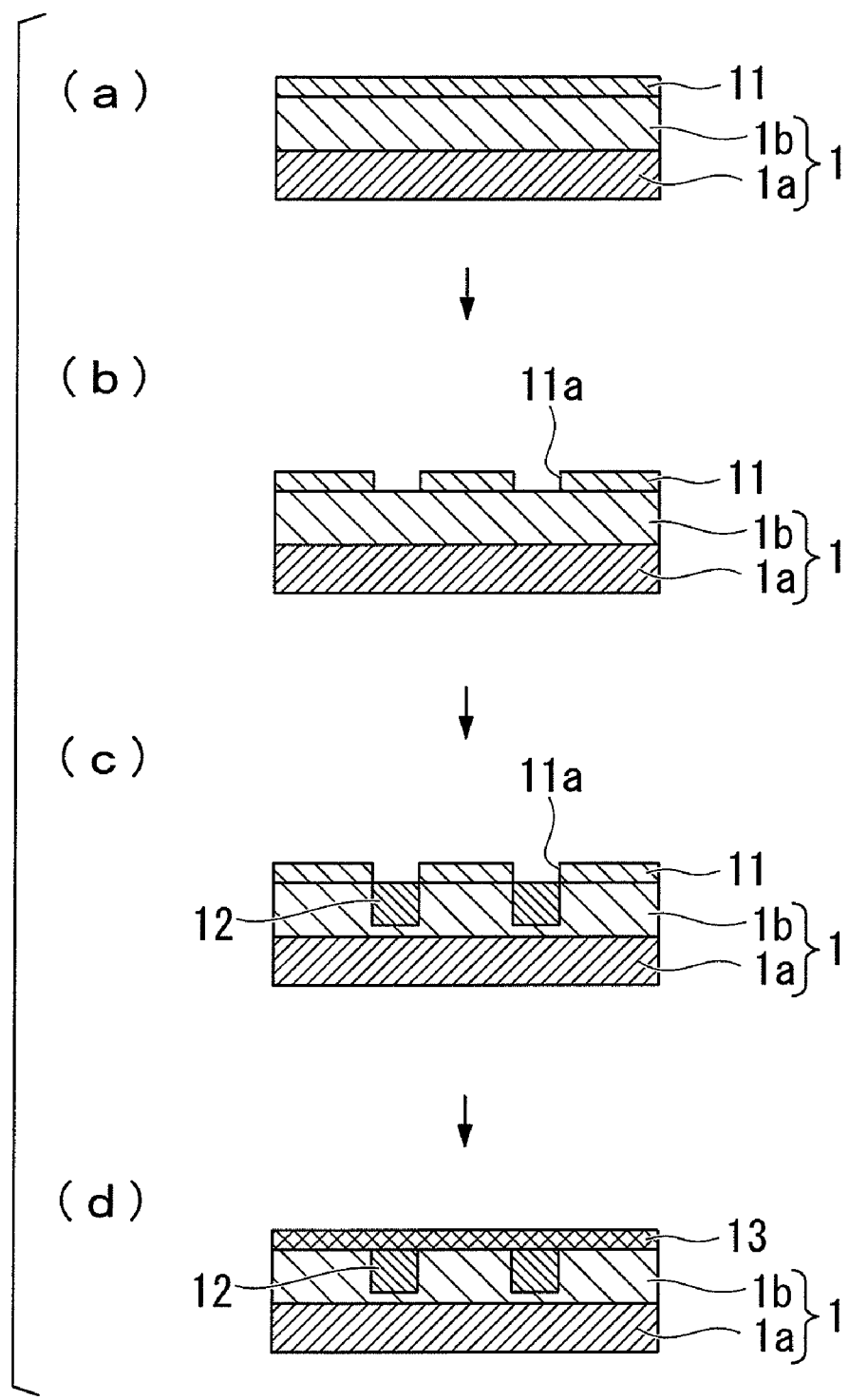
FIG. 2 is a process cross-sectional view illustrating a method for manufacturing the Schottky barrier diode according to the embodiment.

First, as shown in (a) of FIG. 2, the SiC substrate 1 is obtained by epitaxially growing the n$^-$-type semiconductor layer 1b on the surface (here, Si surface) of the n$^+$-type SiC semiconductor substrate 1a.

A CVD method can be used in the formation of the n$^-$-type semiconductor layer 1b. As process conditions, for example, silane and propane which are raw material gases and nitrogen which is a dopant gas are supplied to a chamber under a reduced-pressure atmosphere of $10^{-6}$ Pa or less at a growth temperature of 1600° C. In this way, the n$^-$-type semiconductor layer 1b having a thickness of 8 μm and an impurity concentration of $1 \times 10^{16}$ cm$^{-3}$ is formed.

The n$^-$-type semiconductor layer 1b becomes an active layer forming an active region of the Schottky diode 30, and has a function of securing an off withstanding voltage of the Schottky diode 30. For example, when a Schottky diode having a withstanding voltage of 1.65 V is created, the thickness of the n$^-$-type semiconductor layer 1b is set to 4 to 10 μm, and the impurity concentration thereof is set to $0.5 \times 10^{16}$ to $2.0 \times 10^{16}$ cm$^{-3}$.

Next, as shown in (a) of FIG. 2, a mask layer 11 made of an oxide film is formed on the surface of the n$^-$-type semiconductor layer 1b. In particular, an oxide film is formed on the surface of the n$^-$-type semiconductor layer 1b by a CVD method and the like. In the embodiment, the mask layer 11 made of an oxide film having a thickness of 2.0 μm is formed on the surface of the n$^-$-type semiconductor layer 1b.

Next, as shown in (b) of FIG. 2, an opening 11a is formed by patterning the mask layer 11. The opening 11a is formed so that the surface of the n$^-$-type semiconductor layer 1b for forming the p-type region 7 is exposed.

Next, as shown in (c) of FIG. 2, an impurity for forming the p-type region 7 on the surface of the n$^-$-type semiconductor layer 1b exposed from the opening 11a of the mask layer 11, for example, aluminum (Al) is implanted at an acceleration voltage of 10 to 300 kV. In addition, the concentration of implanted Al is set to, for example, $2.0 \times 10^{18}$ cm$^{-3}$. In this way, an impurity implantation layer 12 is formed.

Next, as shown in (d) of FIG. 2, the mask 11 used in the impurity implantation is removed. Subsequently, a carbon film 13 serving as a protective film in which activation heat treatment is performed is formed on the n$^-$-type semiconductor layer 1b and the impurity implantation layer 12.

A method for forming the carbon film 13 is not particularly limited insofar as a carbon film capable of being used as a protective film in which activation heat treatment is performed can be formed. In particular, for example, a resist is applied on the n$^-$-type semiconductor layer 1b, and then may be heated to form a carbonized film. In addition, the carbon film 13 may be formed by sputtering or CVD.

Next, activation heat treatment is performed using the carbon film 13 as a protective film. The activation heat treatment is performed, for example, in an argon (Ar) atmosphere or an atmosphere in which the pressure is reduced to $1 \times 10^{-2}$ Pa or less, at a heating temperature of 1,600 to 2,000° C., and during a heating time of 1 to 5 minutes. Thereby, the p-type region 7 is formed.

Figure 3:
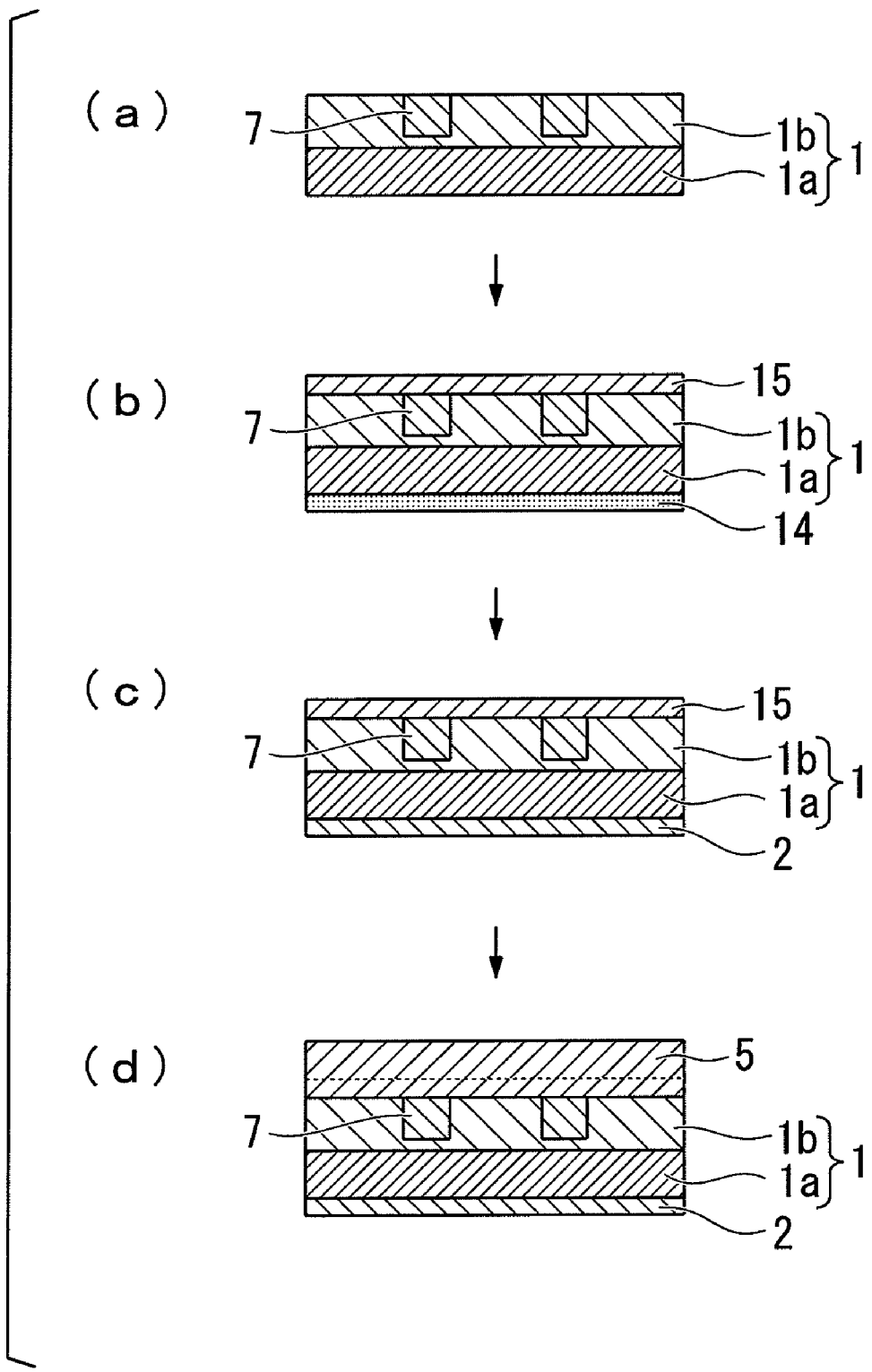
FIG. 3 is a process cross-sectional view illustrating the method for manufacturing the Schottky barrier diode according to the embodiment.
Figure 4:
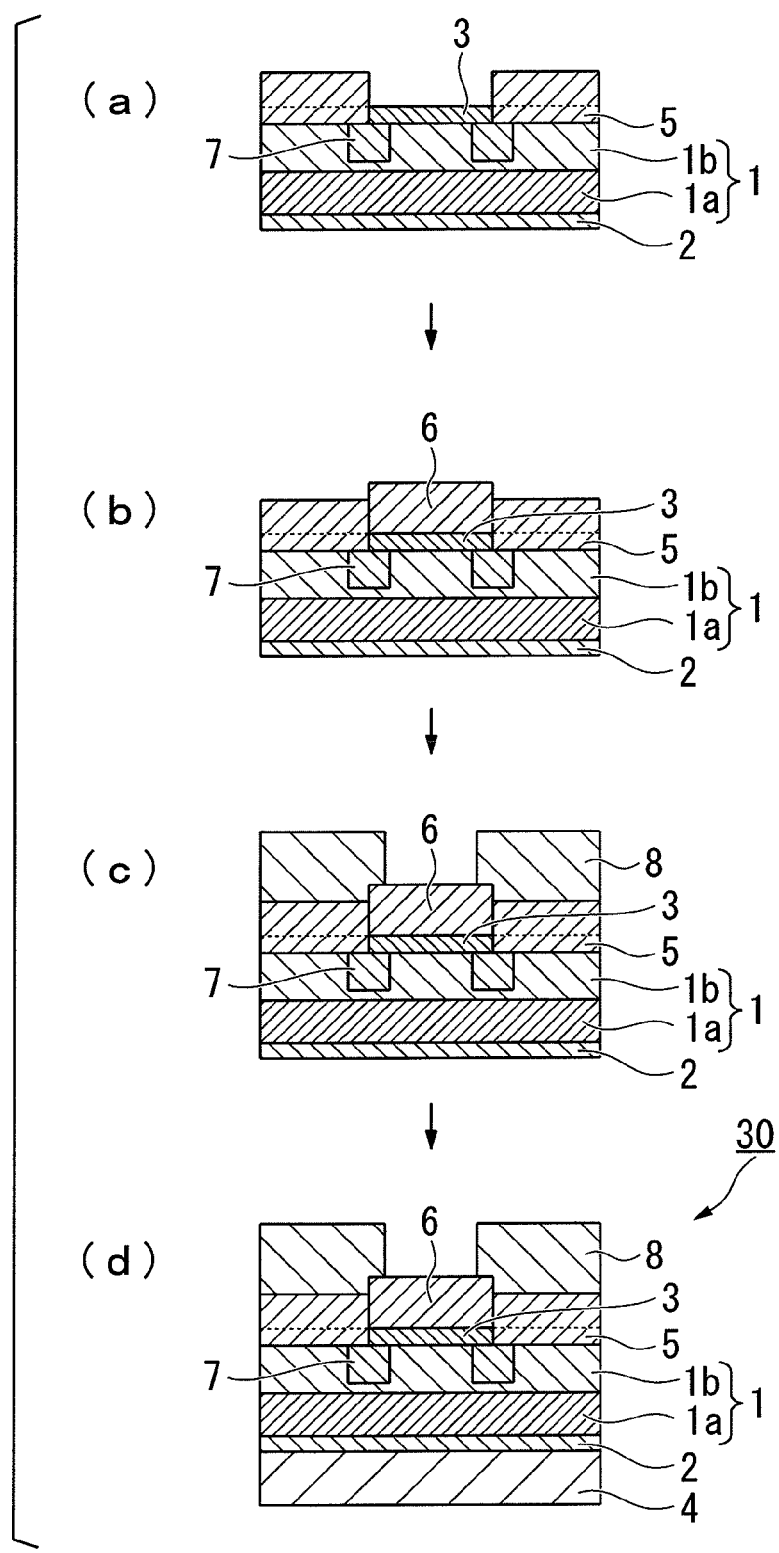
FIG. 4 is a process cross-sectional view illustrating the method for manufacturing the Schottky barrier diode according to the embodiment.

Next, as shown in (a) of FIG. 3, the carbon film 13 used as a protective film is removed. The carbon film 13 is removed by carbonizing the carbon film by thermal oxidation in an oxygen atmosphere.

Next, as shown in (b) of FIG. 3, thermal oxidation processing is performed on the surface and the back of the SiC substrate 1, and oxide films 14 and 15 are respectively formed on the surfaces of the n$^+$-type SiC semiconductor substrate 1a and the n$^-$-type semiconductor layer 1b as surface protective films. This thermal oxidation processing is performed in a dry oxygen atmosphere at a temperature of 1,200° C. for 0.5 hours using a thermal oxidation furnace. Thereby, the oxide film 14 having a thickness of 90 nm or so is formed on the surface of the n$^+$-type SiC semiconductor substrate 1a, and the oxide film 15 having a thickness of 20 nm or so is formed on the surface of the n$^-$-type semiconductor layer 1b.

Next, as shown in (c) of FIG. 3, the ohmic electrode 2 is formed on one surface of the SiC substrate 1, that is, the surface of the n$^+$-type SiC semiconductor substrate 1a.

The ohmic electrode 2 can be formed by, for example, the following method. First, the oxide film 14 formed on the surface of the n$^+$-type SiC semiconductor substrate 1a is removed, and the n$^+$-type SiC semiconductor substrate 1a is exposed. The oxide film 14 can be removed by performing etching using hydrofluoric acid. Next, a film (having a thickness of 200 nm or so) made of, for example, nickel is formed on the exposed n$^+$-type SiC semiconductor substrate 1a as an electrode material (first electrode material) by a vacuum vapor deposition method or a sputtering method.

Subsequently, annealing is performed in an inert atmosphere of argon or the like, at a temperature range of 930 to 950° C. for 1 to 10 minutes. Thereby, nickel reacts with Si in the n$^+$-type SiC semiconductor substrate 1a to form nickel silicide. In this way, the ohmic electrode 2 is formed. Since the nickel silicide is formed in the interface between the ohmic electrode 2 and the n$^+$-type SiC semiconductor substrate 1a, good ohmic characteristics can be realized.

Thereafter, as shown in (d) of FIG. 3, an oxide film is further deposited on the surface of the oxide film 15 formed on the surface of the n$^-$-type semiconductor layer 1b using a CVD method and the like to thereby form the silicon oxide film 5.

Next, as shown in (a) of FIG. 4, a portion of the silicon oxide film 5 is removed, and a Schottky electrode 3 contacting the other surface of the SiC substrate 1, that is, the surface of the n$^-$-type semiconductor layer 1b is formed. The Schottky electrode 3 is provided in a region surrounded by the p-type region 7 in the surface of the n$^-$-type semiconductor layer 1b so as to contact the inner edge in the surface of the p-type region 7.

The Schottky electrode 3 can be formed by, for example, the following method. First, a resist layer which is not shown in the drawing is formed on a predetermined region in the silicon oxide film 5 by well-known photolithography. Thereafter, wet etching is performed using hydrofluoric acid as an etching solution, and the portion which is not covered by a resist layer in the silicon oxide film 5 is removed. Thereby, the surface of the n$^-$-type semiconductor layer 1b is exposed.

Subsequently, an electrode material film (having a thickness of 100 nm or so) made of, for example, molybdenum (Mo) as a second electrode material is formed on the exposed surface of the n$^-$-type semiconductor layer 1b and the resist layer by a vacuum vapor deposition method or a sputtering method. Thereafter, a molybdenum film is patterned (lift-off method) by removing the resist layer, and the Schottky electrode 3 is formed.

In the embodiment, in order to strengthen the adhesion between the Schottky electrode 3 and the n$^-$-type semiconductor layer 1b, the resist layer is removed, and then annealing is performed in an inert atmosphere of argon and the like, at a temperature of 600 to 700° C. for approximately 30 minutes. The above-mentioned heat treatment for stabilization of the Schottky junction is performed at a temperature lower than the annealing temperature of the ohmic electrode 2. In addition, since the temperature of the heat treatment for stabilization of the Schottky junction is lower than the annealing temperature of the ohmic electrode 2, this process is performed after attainment of the annealing temperature of the ohmic electrode 2.

Next, as shown in (b) of FIG. 4, the electrode pad 6 is formed on the surface of the Schottky electrode 3. First, an insulating material (not shown) such as a silicon oxide is deposited using a CVD method so as to cover the Schottky electrode 3. Next, after a contact hole reaching the Schottky electrode 3 is formed in the insulating material by a well-known dry etching technique, the electrode pad 6 is provided inside the contact hole. The electrode pad 6 can be formed by depositing a conductive material such as, for example, nickel/titanium/aluminum (Ni/Ti/Al) inside the contact hole to form a conductive film (having a thickness of, for example, 3 μm), and patterning this conductive film using a well-known photolithography technique and an etching technique.

Next, as shown in (c) of FIG. 4, the protective layer 8 is formed on the surfaces of the silicon oxide film 5 and the electrode pad 6. First, in the protective layer 8, a layer made of an insulating material such as polyimide is formed so as to cover the surfaces of the silicon oxide film 5 and the electrode pad 6. Next, an opening is formed in a portion of the protective layer 8 by patterning the layer using a well-known photolithography technique and an etching technique, and the upper surface of the electrode pad 6 is exposed from this opening.

Next, as shown in (d) of FIG. 4, the electrode pad 4 is formed on the surface of the ohmic electrode 2.

The electrode pad 4 is formed by depositing a conductive material such as titanium/nickel/silver (Ti/Ni/Ag) on the surface of the ohmic electrode 2. In this way, the Schottky barrier diode 30 is obtained.

As described above, according to the method for manufacturing the Schottky bather diode 30 of the embodiment, the configuration is made such that the temperature range of the heat treatment at the time of forming the ohmic electrode 2 on one surface of the SiC substrate 1, that is, the surface of the n$^+$-type SiC semiconductor substrate 1a is limited to 930 to 950° C. The Schottky bather diode 30 having a high forward current and a low reverse leakage current is obtained by forming the Schottky electrode 3 on the other surface of the SiC substrate 1, that is, the surface of the n$^-$-type semiconductor layer 1b. As can be seen from the above, when the ohmic electrode 2 is formed, it is possible to manufacture the Schottky barrier diode 30 having a high forward current and a low reverse leakage current by a simple method in which the heat treatment temperature is set to the optimum temperature range.

The technical scope of the invention is not limited to the above-mentioned embodiment, but various modifications can be added without departing from the gist of the invention. For example, in the embodiment, although the n$^-$-type semiconductor layer 1b is epitaxially grown on the Si surface in the n$^+$-type SiC semiconductor substrate 1a, the Schottky diode may be formed by epitaxially growing the n$^-$-type semiconductor layer 1b on the C surface. Moreover, in the embodiment, although the silicon oxide film 5 (thermal oxide film, CVD oxide film) is used as a protective film, polyimide may be formed directly on the semiconductor surface without using this. In addition, this method can be similarly applied to FETs or integrated devices including a Schottky barrier in the components without being limited to the single Schottky barrier diode.

EXAMPLES

Hereinafter, effects of the invention will be specifically described with reference to examples. However, the invention is not limited to these examples.

Example 1

Sample Preparation

A Schottky barrier diode of the example was manufactured by the following procedure.

First, as a SiC semiconductor, an n-type 4H—SiC semiconductor layer was prepared which was epitaxially grown to a thickness of 8 μm and at a carrier concentration of $1\times10^{16}$ cm$^{-3}$, on an n-type 4H—SiC semiconductor substrate (its thickness was 350 μm and its resistivity was 0.02 Ωcm) having a diameter of 3 inches.

Next, the surface of the above-mentioned SiC semiconductor was cleaned, and then was heated in an oxygen atmosphere at 1,200° C. for 2 hours, to form a thermal oxide film. Thereafter, a resist film was applied to the n-type 4H—SiC semiconductor epitaxial layer side, and the thermal oxide film on the 4H—SiC semiconductor substrate side was removed by immersion in HF for 10 minutes. The resist film was removed by immersion in an organic solvent. In this way, the thermal oxide film was formed only on the n-type 4H—SiC semiconductor epitaxial layer side.

Next, the above-mentioned SiC semiconductor was put into a vapor deposition apparatus, and nickel (Ni) was evaporated on the 4H—SiC semiconductor substrate side so as to have a thickness of 100 nm. Then, the semiconductor was put into a chamber and was heated in an argon (Ar) atmosphere at 950° C. for 3 minutes, to perform heat treatment. In this way, the nickel was silicified, and an ohmic electrode having good contact resistance was formed.

Next, the SiC semiconductor was immersed in HF to remove the thermal oxide film on the n-type 4H—SiC semiconductor epitaxial layer side, and a resist pattern was formed on the surface at the n-type 4H—SiC semiconductor epitaxial layer side so that a Schottky electrode was formed to 2 square mm using a photolithography technique. Then, the SiC semiconductor was put into the vapor deposition apparatus, and molybdenum (Mo) was formed on the surface at the epitaxial layer side of the n-type 4H—SiC semiconductor layer, to create a pattern of the Schottky electrode by performing lift-off in an organic solvent.

The semiconductor was put into the chamber, to perform heat treatment in an argon (Ar) atmosphere at 650° C. for 10 minutes. In this way, a molybdenum (Mo) electrode having Schottky characteristics was formed.

(Characteristics Evaluation)

In the Schottky barrier diode of the example manufactured in this way, the leakage current at the time of applying a reverse voltage of 300 V was $1\times10^{-6}$ A or less. In addition, the forward current at the time of applying a forward voltage of 1.65 V was 500 A/cm$^2$. From the above, it was confirmed that the silicon carbide semiconductor device of the invention had both of the low leakage current and the high forward current (low forward voltage) to a high degree.

Example 2

Sample Preparation

A Schottky bather diode of the example was manufactured by the following procedure.

First, as a SiC semiconductor, an n-type 4H—SiC semiconductor layer was prepared which was epitaxially grown to a thickness of 8 μm and at a carrier concentration of $1\times10^{16}$ cm$^{-3}$, on an n-type 4H—SiC semiconductor substrate (its thickness was 350 μm and its resistivity was 0.02 Ωcm) having a diameter of 3 inches.

Next, the surface of the above-mentioned SiC semiconductor was cleaned, and then was heated in an oxygen atmosphere at 1,200° C. for 2 hours, to form a thermal oxide film. Thereafter, a resist film was applied to the n-type 4H—SiC semiconductor epitaxial layer side, and the thermal oxide film on the 4H—SiC semiconductor substrate side was removed by immersion in HF for 10 minutes. The resist film was removed by immersion in an organic solvent. In this way, the thermal oxide film was formed only on the n-type 4H—SiC semiconductor epitaxial layer side.

Next, the above-mentioned SiC semiconductor was put into a vapor deposition apparatus, and nickel (Ni) was evaporated on the 4H—SiC semiconductor substrate side so as to have a thickness of 100 nm. Then, the semiconductor was put into a chamber and was heated in an argon (Ar) atmosphere at 930° C. for 3 minutes, to perform heat treatment. In this way, the nickel was silicified, and an ohmic electrode having good contact resistance was formed.

Next, the SiC semiconductor was immersed in HF to remove the thermal oxide film on the n-type 4H—SiC semiconductor epitaxial layer side, and a resist pattern was formed on the surface at the n-type 4H—SiC semiconductor epitaxial layer side so that a Schottky electrode was formed to 2 square mm using a photolithography technique. Then, the SiC semiconductor was put into the vapor deposition apparatus, and molybdenum (Mo) was formed on the surface at the epitaxial layer side of the n-type 4H—SiC semiconductor layer, to create a pattern of the Schottky electrode by performing lift-off in an organic solvent.

The semiconductor was put into the chamber, to perform heat treatment in an argon (Ar) atmosphere at 650° C. for 10 minutes. In this way, a molybdenum (Mo) electrode having Schottky characteristics was formed.

(Characteristics Evaluation)

In the Schottky barrier diode of the example manufactured in this way, the leakage current at the time of applying a reverse voltage of 300 V was $1\times10^{-6}$ A or less. In addition, the forward current at the time of applying a forward voltage of 1.65 V was 500 A/cm$^2$. From the above, it was confirmed that the silicon carbide semiconductor device of the invention had both of the low leakage current and the high forward current to a high degree.

Comparative Example 1

Sample Preparation

A Schottky barrier diode of the example was manufactured by the following procedure.

First, as a SiC semiconductor, an n-type 4H—SiC semiconductor layer was prepared which was epitaxially grown to a thickness of 8 μm and at a carrier concentration of $1\times10^{16}$ cm$^{-3}$, on an n-type 4H—SiC semiconductor substrate (its thickness was 350 μm and its resistivity was 0.02 Ωcm) having a diameter of 3 inches.

Next, the surface of the above-mentioned SiC semiconductor was cleaned, and then was heated in an oxygen atmosphere at 1,200° C. for 2 hours, to form a thermal oxide film. Thereafter, a resist film was applied to the n-type 4H—SiC semiconductor epitaxial layer side, and the thermal oxide film on the 4H—SiC semiconductor substrate side was removed by immersion in HF for 10 minutes. The resist film was removed by immersion in an organic solvent. In this way, the thermal oxide film was formed only on the n-type 4H—SiC semiconductor epitaxial layer side.

Next, the above-mentioned SiC semiconductor was put into a vapor deposition apparatus, and nickel (Ni) was evaporated on the 4H—SiC semiconductor substrate side so as to have a thickness of 100 nm. Then, the semiconductor was put into a chamber and was heated in an argon (Ar) atmosphere at 970° C. for 3 minutes, to perform heat treatment. In this way, the nickel was silicified, and an ohmic electrode having good contact resistance was formed.

Next, the SiC semiconductor was immersed in HF to remove the thermal oxide film on the n-type 4H—SiC semiconductor epitaxial layer side, and a resist pattern was formed on the surface at the n-type 4H—SiC semiconductor epitaxial layer side so that a Schottky electrode was formed to 2 square mm using a photolithography technique. Then, the SiC semiconductor was put into the vapor deposition apparatus, and molybdenum (Mo) was formed on the surface at the epitaxial layer side of the n-type 4H—SiC semiconductor layer, to create a pattern of the Schottky electrode by performing lift-off in an organic solvent.

The semiconductor was put into the chamber, to perform heat treatment in an argon (Ar) atmosphere at 650° C. for 10 minutes. In this way, a molybdenum (Mo) electrode having Schottky characteristics was formed.

(Characteristics Evaluation)

In the Schottky barrier diode of the example manufactured in this way, the leakage current at the time of applying a reverse voltage of 300 V was $1\times10^{-7}$ A or more, and it was confirmed that the leakage current became high with respect to the heat treatment temperature of the ohmic electrode of 950° C. or lower.

Comparative Example 2

Sample Preparation

A Schottky barrier diode of the example was manufactured by the following procedure.

First, as a SiC semiconductor, an n-type 4H—SiC semiconductor layer was prepared which was epitaxially grown to a thickness of 8 μm and at a carrier concentration of $1\times10^{16}$ cm$^{-3}$, on an n-type 4H—SiC semiconductor substrate (its thickness was 350 μm and its resistivity was 0.02 Ωcm) having a diameter of 3 inches.

Next, the surface of the above-mentioned SiC semiconductor was cleaned, and then was heated in an oxygen atmosphere at 1,200° C. for 2 hours, to form a thermal oxide film. Thereafter, a resist film was applied to the n-type 4H—SiC semiconductor epitaxial layer side, and the thermal oxide film on the 4H—SiC semiconductor substrate side was removed by immersion in HF for 10 minutes. The resist film was removed by immersion in an organic solvent. In this way, the thermal oxide film was formed only on the n-type 4H—SiC semiconductor epitaxial layer side.

Next, the above-mentioned SiC semiconductor was put into a vapor deposition apparatus, and nickel (Ni) was evaporated on the 4H—SiC semiconductor substrate side so as to have a thickness of 100 nm. Then, the semiconductor was put into a chamber and was heated in an argon (Ar) atmosphere at 900° C. for 3 minutes, to perform heat treatment. In this way, the nickel was silicified, and an ohmic electrode having good contact resistance was formed.

Next, the SiC semiconductor was immersed in HF to remove the thermal oxide film on the n-type 4H—SiC semiconductor epitaxial layer side, and a resist pattern was formed on the surface at the n-type 4H—SiC semiconductor epitaxial layer side so that a Schottky electrode was formed to 2 square mm using a photolithography technique. Then, the SiC semiconductor was put into the vapor deposition apparatus, and molybdenum (Mo) was formed on the surface at the epitaxial layer side of the n-type 4H—SiC semiconductor layer, to create a pattern of the Schottky electrode by performing lift-off in an organic solvent.

The semiconductor was put into the chamber, to perform heat treatment in an argon (Ar) atmosphere at 650° C. for 10 minutes. In this way, a molybdenum (Mo) electrode having Schottky characteristics was formed.

(Characteristics Evaluation)

In the Schottky barrier diode of the example manufactured in this way, the forward voltage in the forward current of 500 A/cm$^2$ was 1.75 V or more, and it was confirmed that the forward voltage became high with respect to the heat treatment temperature of the ohmic electrode of 930° C. or higher.

<Characteristics Evaluation>

The influence of the annealing temperature at the time of forming the ohmic electrode was confirmed using the Schottky barrier diode obtained in the above-mentioned examples and comparative examples. The size of the Schottky electrode was 2 square mm.

(Temperature Dependence of Reverse Leakage Current)

Figure 5:
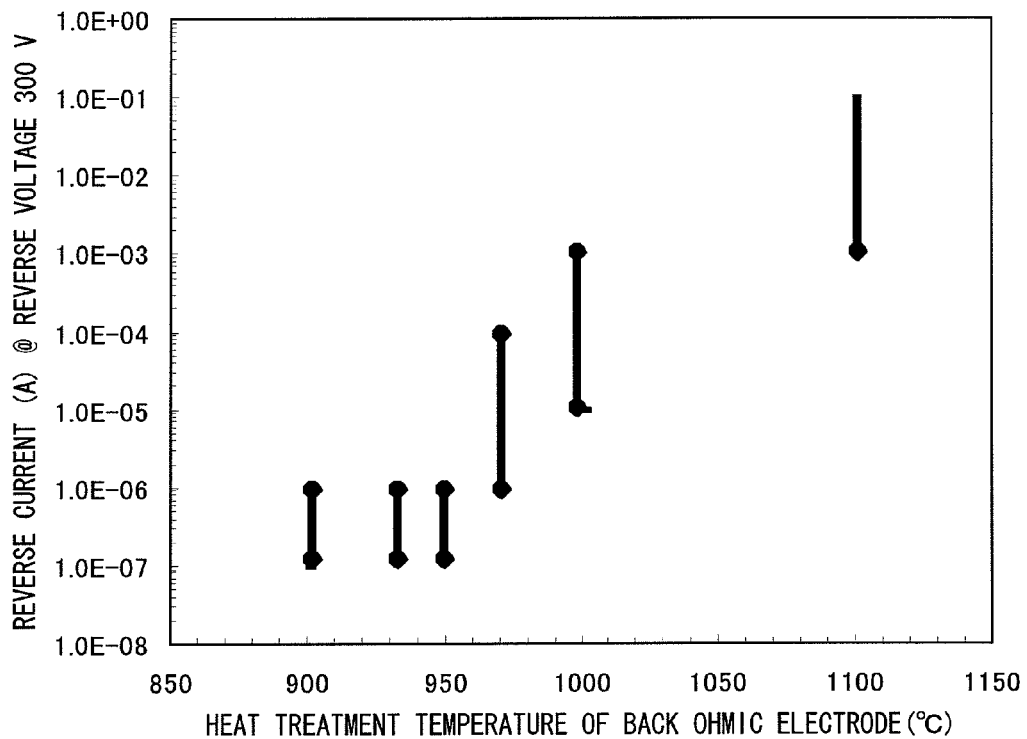
FIG. 5 is a diagram explaining examples, and a diagram illustrating the relationship between the heat treatment temperature at the time of forming an ohmic electrode and the reverse leakage current.

FIG. 5 is a diagram illustrating the relationship between the heat treatment temperature at the time of forming the ohmic electrode and the reverse leakage current. As shown in FIG. 5, it was known that the reverse leakage current in the reverse applied voltage of 300 V increased when the annealing temperature at the time of forming the ohmic electrode was higher than the specific temperature. That is, when the reverse leakage current value of $1 \times 10^6$ A in the reverse applied voltage of 300 V, which is generally required, was used as a reference, it was known that the annealing temperature at the time of forming the ohmic electrode 2 was achieved at 950° C. or lower.

(Temperature Dependence of Forward Voltage)

Figure 6:
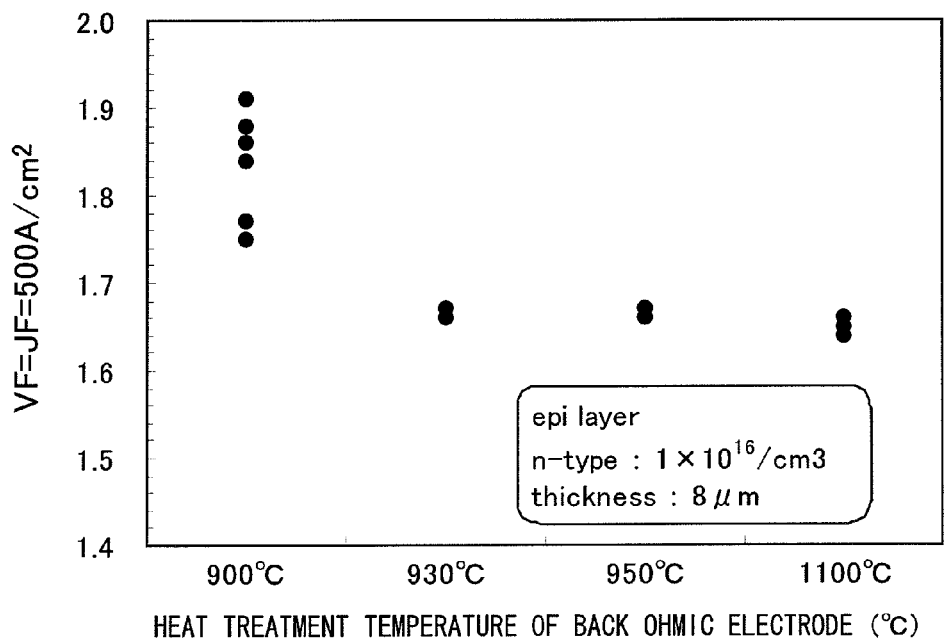
FIG. 6 is a diagram explaining the examples, and a diagram illustrating the relationship between the heat treatment temperature at the time of forming the ohmic electrode and the forward voltage.

FIG. 6 is a diagram illustrating the relationship between the heat treatment temperature at the time of forming the ohmic electrode and the forward voltage. As shown in FIG. 6, when the annealing temperature at the time of forming the ohmic electrode is higher than the specific temperature, the forward voltage at the time of causing the amount of 500 A/cm$^2$ to flow decreases due to a decrease in the contact resistance of the ohmic electrode. Therefore, it was known that the case where the forward voltage is stabilized and becomes a voltage of 1.65 V which is a target value was achieved at the annealing temperature of 930° C. or higher.

From the result of investigation of the temperature dependence of the reverse leakage current and the forward voltage, the heat treatment temperature at the time of forming the ohmic electrode showed an optimum range at a temperature of 930° C. to 950° C. It was confirmed that the Schottky barrier diode was obtained which has characteristics that the resistance value at the time of causing the forward current to flow is small and the leakage current at the time of applying the reverse voltage is low, by setting the heat treatment temperature to the optimum range.

Here, it was confirmed that the annealing temperature at the time of forming the ohmic electrode influenced the reverse leakage current from the comparative experiment in which the formation of the ohmic electrode was performed after the formation of the Schottky electrode and annealing was not performed. In this case, the reverse leakage current is stabilized in a low level. However, in such conditions, the contact resistance of the ohmic electrode was large, and thus it was known that the conditions could not be adopted as preparation conditions of the practical Schottky barrier diode.

In addition, even when a similar experiment was performed before the Schottky electrode was attached and after only heat history was applied without attaching the ohmic electrode, it was also confirmed that the reverse leakage current was stable in a low level.

As seen from the above, although the reason that the annealing temperature of the ohmic electrode formed on one surface of the SiC substrate influences the leakage current of the Schottky electrode formed on the other surface thereof is not obvious at this time, defects of easy movement through voids or the defective crystal from one surface of the SiC substrate are considered to be the cause.

When annealing was performed at a constant temperature or higher in the state where the electrode material (Ni or Ni—Ti) of the ohmic electrode was attached, the surface condition at the Schottky electrode side changed. That is, it is estimated that only the electrical state changes from the electron concentration through scanning capacitance measurement. However, in this case, it is estimated that defects of EPD and the like through KOH etching, surface morphology of the level measured by AFM, impurities measured by SIMS, and the like do not change at all, and that only the electrical state changes.

INDUSTRIAL APPLICABILITY

The invention can be applied to a method for manufacturing a silicon carbide semiconductor device.

REFERENCE SIGNS LIST

1: SILICON CARBIDE (SiC) SUBSTRATE
1a: n$^+$-TYPE SiC SEMICONDUCTOR SUBSTRATE
1b: n$^-$-TYPE SiC SEMICONDUCTOR LAYER
2: OHMIC ELECTRODE (ELECTRODE HAVING AN OHMIC PROPERTY)
3: SCHOTTKY ELECTRODE (ELECTRODE HAVING A SCHOTTKY PROPERTY)
4, 6: ELECTRODE PAD
5: SILICON OXIDE FILM
7: p-TYPE REGION
8: PROTECTIVE LAYER
30: SCHOTTKY BARRIER DIODE (SILICON CARBIDE SEMICONDUCTOR DEVICE)

The invention claimed is:

1. A method for manufacturing a silicon carbide semiconductor device, comprising the steps of:
   forming a film made of a first electrode material on one surface of a silicon carbide substrate, and forming an ohmic electrode by performing heat treatment at a temperature range of 930 to 950° C.; and
   forming a film made of a second electrode material on the other surface of the silicon carbide substrate, and forming a Schottky electrode by performing heat treatment,
   wherein the first electrode material includes at least nickel and the film made of the first electrode has a thickness ranging from 50 to 200 nm.

2. The method for manufacturing a silicon carbide semiconductor device according to claim 1, wherein the second electrode material is molybdenum.

3. The method for manufacturing a silicon carbide semiconductor device according to claim 1, wherein the heat treatment temperature in the step of forming the Schottky electrode is in the range of 600 to 700° C.

4. The method for manufacturing a silicon carbide semiconductor device according to claim 1, wherein the silicon carbide semiconductor device is a Schottky barrier diode.

* * * * *